(12) United States Patent
Choi et al.

(10) Patent No.: US 6,335,243 B1
(45) Date of Patent: Jan. 1, 2002

(54) METHOD OF FABRICATING NONVOLATILE MEMORY DEVICE

(75) Inventors: Woong-Lim Choi; Kyeong-Man Ra, both of Cheongju-si (KR)

(73) Assignee: LG Semicon Co., Ltd., Chungcheongbuk-Do (KR)

( * ) Notice: Subject to any disclaimer, the term of this patent is extended or adjusted under 35 U.S.C. 154(b) by 0 days.

(21) Appl. No.: 09/016,399

(22) Filed: Jan. 30, 1998

(30) Foreign Application Priority Data

Jul. 9, 1997 (KR) .......................................... 97-31837

(51) Int. Cl.[7] ..................... H01L 21/336; H01L 21/3205
(52) U.S. Cl. ....................... 438/257; 438/262; 438/263; 438/264; 438/594
(58) Field of Search ................................ 438/257, 262, 438/588, 593, 594, 263, 264; 257/316, 317, 321, 320, 319, 315

(56) References Cited

U.S. PATENT DOCUMENTS

| 4,267,632 A | | 5/1981 | Shappir ........................ 29/571 |
|---|---|---|---|
| 5,025,494 A | * | 6/1991 | Gill ............................. 257/316 |
| 5,502,321 A | * | 3/1996 | Matsushita .................. 257/316 |
| 5,661,053 A | * | 8/1997 | Yuan ........................... 438/257 |
| 5,859,454 A | * | 1/1999 | Choi et al. .................. 257/316 |

OTHER PUBLICATIONS

S. Wolf, Silicon Processing for the VLSI Era, vol. 2, Lattice Press, pp. 18 and 19, 1990.*
Hitoshi Kume, et al., A 1.28 $\mu M^2$ Contactless Memory Cell Technology for a 3V–Only 64 Mbit EEPROM; International Electron Devices Meeting; pp. 24.7.1–24.7.3 Dec. 13–16, 1992.

* cited by examiner

Primary Examiner—Olik Chaudhuri
Assistant Examiner—Shrinivas H Rao
(74) Attorney, Agent, or Firm—Morgan, Lewis & Bockius LLP

(57) ABSTRACT

A method of fabricating a nonvolatile memory device having a first conductivity type substrate, includes the steps of forming a gate insulating layer on the entire surface of the semiconductor substrate, forming a plurality of floating gate lines on the gate insulating layer, forming first sidewall spacers on both sides of each floating gate, forming a plurality of impurity regions having a second conductivity type in the substrate between the floating gate lines, forming a dielectric layer on the floating gate lines, forming a plurality of control gate lines on the dielectric layer, forming second sidewall spacers on both sides of the control gate lines, selectively etching the dielectric layer and the floating gate lines to form a plurality of floating gates, forming tunneling insulating layers on both sides of the floating gates, and forming a plurality of program lines between the impurity regions.

25 Claims, 19 Drawing Sheets

METHOD OF FABRICATING NONVOLATILE MEMORY DEVICE

This application claims the benefit of Korean Application No. 31837/1997 filed on Jul. 9, 1997, which is hereby incorporated by reference.

BACKGROUND OF THE INVENTION

1. Field of the Invention

The present invention relates to a semiconductor device, and more particularly, to a method of fabricating a nonvolatile memory device. Although the present invention is suitable for a wide scope of applications, it is particularly suitable for fabricating a nonvolatile memory device having a minimum effective cell size.

2. Discussion of the Related Art

There are two factors determining an effective size of a memory cell: cell size itself and construction of cell array. Thus, a packing density of a nonvolatile memory device, such as an electrically erasable programmable read only memory (EEPROM) and a flash EEPROM, is limited by the effective size of the memory cell. Further, a minimum cell construction for the memory cell is a simple stacked-gate structure.

As the nonvolatile memory devices have been widely used in electronics industries, researches and developments are directed to such devices. Yet, cost-per-bit of a memory is still too expensive so that the nonvolatile semiconductor memory device can not be readily applicable for mass storage media. Further, low power consuming devices are more preferable for applications in the area of portable electronics. As a result, developments and researches for the nonvolatile memory devices have been specifically directed to reduce the cost-per-bit.

A packing density of a conventional nonvolatile memory device depends on the number of memory cells therein. On the other hand, multi-bit cells store a data of one bit or more than one bit in a memory cell, so that the packing density of the storing data can be increased without decreasing the size of the memory cell.

In order to obtain the aforementioned multi-bit cell, more than two threshold voltage levels should be programmed for each memory cell. For example, to store a data of two bits in a cell, each cell should be programmed in four threshold voltage levels ($2^2$=4). The four threshold voltage levels are 00, 01, 10, and 11 in a logic state. In such multi-level programing, one of the significant problems in each threshold voltage level is the statistical distribution. For example, a value of the distribution is about 0.5 V.

Therefore, the distribution has to be reduced by adjusting each threshold voltage level. Consequently, more threshold voltage levels can be programmed and the number of bits per cell is increased. One of the ways to reduce the voltage distribution is to program the memory cell by alternately repeating programming steps and verifying steps. A series of voltage pulses are applied to the cells to program the nonvolatile memory cells to have desired threshold voltage levels. Then, a reading step is performed between the voltage pulses to verify whether or not the cells reach the desired threshold voltage levels. During each verification step, if a verified threshold voltage level value reaches the threshold voltage level, the programming is completed.

However, it is difficult to reduce the error distribution in threshold voltage levels by adjusting a finite program voltage pulse width in the aforementioned method. Further, since algorithm circuit alternately repeats programming and verifying steps, a peripheral circuit area in the device is increased and an operation period becomes too long.

FIGS. 1A and 1B are a schematic diagram and a cross-sectional view of a conventional nonvolatile memory device having a simple stacked-gate structure, respectively.

As shown in FIG. 1B, a floating gate 3 and a tunneling oxide layer 2 are successively formed on a p-type semiconductor substrate 1. A dielectric layer 4 is formed and a control gate 5 are formed on the floating gate 3. N-type source and drain regions 6a and 6b are formed below the surface of the semiconductor substrate 1 at both sides of the floating gate 3.

In such nonvolatile memory device having the aforementioned structure, an effective cell size is inevitably small. Generally, the shorter the effective cell size, the lower the coupling constant. As a result, a coupling constant for the control gate 5 is low. Accordingly, in order to improve a low coupling constant, a dielectric layer 4 (for example, oxide nitride oxide) is formed between the floating gate 3 and the control gate 5. However, complex processes including an annealing at a high temperature is required to form the dielectric layer 4.

Referring to FIG. 1A, each nonvolatile memory cell includes a floating gate 3, a control gate 5 for adjusting charges provided in the floating gate 3, and an electric field effect transistor for reading or verifying the amount of charge carriers provided in the floating gate 3 during programming. More specifically, the electric field transistors includes a floating gate 3, a source 6a, a drain 6b, and a channel region 7 formed between the source and drain 6a and 6b.

When a voltage applied to the control gate 5 and the drain 6b is high enough to perform programming, a current flows between the drain 6b and the source 6a. If the current is the same as or smaller than a reference current, a programming completion signal is generated.

A conventional nonvolatile memory device will be described with reference to the accompanying drawings.

FIG. 2 is a circuit diagram of a conventional nonvolatile memory device. As shown in FIG. 2, a plurality of metal bit lines 209 are formed to be spaced apart from one another by a predetermined distance in a column direction. A plurality of word lines 210 are formed to be perpendicular to the metal bit lines 209. A common source line 211 per two word lines 210 is formed in parallel with the word lines 210.

The drains 6b shown in FIG. 1A are connected to the metal bit lines 209 and the sources 6a are connected to the common source lines 211. Thus, one metal contact hole 208 per two cells is required, so that an effective size of the memory cells become larger taking in consideration of the metal contact holes 208. In other words, as previously described in FIG. 1B, the conventional nonvolatile memory device has a simple stacked-gate structure to minimize the cell size. The effective size, however, is limited by a pitch of the metal contact holes 208.

To solve this problem, the metal contact holes are eliminated in an array of the memory cell. Thus, the array of the cell employs a simple stacked-gate structure without the metal contact holes to minimize the effective cell size. Nonetheless, a program disturbance occurs in a deselected cell adjacent to a direction of the word lines.

FIG. 3 illustrates another conventional nonvolatile memory device using split-channel cells to have an asymmetry structure where selection gates 312 are formed. In this device, the problem of a simple stacked-gate structure cell can be solved because the program disturbance and over-erasure are eliminated in programming by a hot electron injection.

The nonvolatile memory device shown in FIG. 3 includes a plurality of word lines 310 formed on a semiconductor substrate (not shown) separated from one another by a predetermined distance, bit lines 313 formed to be perpendicular to the word lines 310 to form a plurality of squares, and a plurality of nonvolatile memory cells disposed as a square.

Each nonvolatile memory cell shown in FIG. 3 includes a floating gate 3, as shown in FIG. 1A, a control gate 5 for adjusting the amount of charge provided for the floating gate 3 in programming, and an electric field effect transistor for reading or verifying the amount of charge carriers provided for the floating gate 3 during programming. Specifically, the electric field effect transistor includes a floating gate 3, a source 6a, a drain 6b, and a channel region 7 formed between the drain and source 6a and 6b.

A control gate 5 of each nonvolatile memory cell is connected to the adjacent word line 310, and the source 6a of the nonvolatile memory cell within a square is commonly connected to the bit line 313 adjacent to the drain of a nonvolatile memory cell neighboring the square. The selection transistors 312 are connected to the bit line 313, and a metal contact hole 308 per thirty two nonvolatile memory cells or more is connected to the selection transistor 312 in a column direction. Therefore, an effective cell size can be reduced using this type of array.

However, a large size of a unit cell is still problematic because of the gates in the selection transistors. Furthermore, programming using tunneling effect is almost impossible because it is operated with a low power consumption. This is because two cells neighboring in a direction of word lines 310 are operated with almost the same bias condition.

To solve those problems and enable the tunneling programming, a memory cell array having a simple stacked-gate structure without metal contact holes is suggested as shown in FIG. 4. A plurality of metal data lines 409 are formed and spaced apart from one another by a predetermined distance in a column direction. Each bit line is completely divided by a source line 415 and a drain line 414 in parallel with the metal data lines 409.

The source 6a shown in FIG. 1B is connected to the source line 415 and the drain 6b of a nonvolatile memory cell is connected to the drain line 414. One metal contact hole 408 is connected to each metal data line 409, and the control gates 5 are connected (not shown), perpendicular to the bit lines divided by the source and drain lines 415 and 414, to a plurality of word lines 410. However, even in this structure, a size of a unit cell increases due to a division of the bit lines.

FIG. 5 is a cross-sectional view showing a structure of a nonvolatile memory device having split channel cells. As shown in FIG. 5, a floating gate 503 and an oxide layer 502 are successively formed on a p-type semiconductor substrate 501. A control gate 505 is formed over the floating gate 503. An insulating layer 516 is formed on the entire surface and then a selection gate 517 is formed on the entire surface including the control gate 505 and the floating gate 503. A dielectric layer 504 is formed between the control gate 505 and the floating gate 503. Subsequently, a source 506a is formed below the surface of the semiconductor substrate 501 to be set off from the floating gate 503. A drain 506b is also formed below the surface of the semiconductor substrate 501 at the other side of the floating gate 503.

FIG. 6A is a cross-sectional view of another conventional nonvolatile memory device having split channel cells. FIG. 6B is a cross-sectional view of the nonvolatile memory device in a direction of the channel width shown in FIG. 6A.

Referring to FIG. 6A, floating gates 603 are formed over a p-type semiconductor substrate 601, spaced apart from one another by a predetermined distance and a control gate 605 is formed over the floating gate 603. A tunneling oxide layer 602 is formed between the floating gate 603 and the semiconductor substrate 601. A dielectric layer 604 is formed between the floating gate 603 and the control gate 605. A source 606a is formed below the surface of the semiconductor substrate 601 to be offset from the floating gate 603. A drain 6b is also formed below the surface of the semiconductor substrate 601 at the other side of the floating gate 603.

In FIG. 6B, the nonvolatile memory device includes field oxide layer 618, spaced apart from one another by a predetermined distance, formed on a surface of the semiconductor substrate 601 for insulating one cell from another. A gate insulating layer 619 are formed on the semiconductor substrate 601 between the field oxide layers 618. A floating gate 603 are formed to partially overlap with the field oxide layer 618. A dielectric layer 604 is formed on a predetermined area over the floating gate 603. A control gate 605 are formed on the dielectric layer 604. A cap insulating layer 620 are formed on the control gate 605 and sidewall spacers 621 are formed on both sides of the cap insulating layer 620 and the control gate 605. An erasure gate 617 are formed on the cap insulating layer 620 including the field oxide layer 618. A tunneling oxide layer 622 are formed at the interface of the floating gate 603 and the erasure gate 617.

However, all of the conventional nonvolatile memory devices still have one or more problems as described above. Again, even with the array having a simple stacked-gate structure without metal contact holes to provide a minimum effective cell size, program disturbance can not be eliminated in the conventional devices.

SUMMARY OF THE INVENTION

Accordingly, the present invention is directed to a method of fabricating a nonvolatile memory device that substantially obviates one or more of problems due to limitations and disadvantages of the related art.

An object of the invention is to provide a method of fabricating a nonvolatile memory device having a simple stacked-gate structure to form a contactless array, thereby accomplishing a minimum effective cell size.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a nonvolatile memory device includes the steps of preparing a semiconductor substrate of first conductivity type, forming a gate insulating layer on the entire surface of the semiconductor substrate, forming on the gate insulating layer a plurality of conductive lines spaced apart from one another by a predetermined distance in a direction, forming first sidewall spacers on sides of each of the conductive lines, forming a plurality of buried impurity regions of second conductivity type in the semiconductor substrate between the conductive lines, forming a dielectric film on the surface of the conductive lines, forming on the dielectric film a plurality of control gate lines and cap insulating layers spaced apart at right angle to the conductive lines, forming second sidewall spacers on sides of the control gate lines and the cap insulating layers, selectively etching the dielectric film and the conductive lines by using the control gate lines and the second sidewall spacers as masks, so as to form a plurality of floating gates, forming tunneling insulating layers on sides of the floating gates, and forming a plurality of program lines between the buried impurity regions in same direction as the impurity regions.

In another aspect of the present invention, the method of fabricating a nonvolatile memory device having a first conductivity type substrate includes the steps of forming a gate insulating layer on the entire surface of the semiconductor substrate, forming a plurality of floating gate lines on the gate insulating layer, forming first sidewall spacers on both sides of each floating gate, forming a plurality of impurity regions having a second conductivity type in the substrate between the floating gate lines, forming a dielectric layer on the floating gate lines, forming a plurality of control gate lines on the dielectric layer, forming second sidewall spacers on both sides of the control gate lines, selectively etching the dielectric layer and the floating gate lines to form a plurality of floating gates, forming tunneling insulating layers on both sides of the floating gates, and forming a plurality of program lines between the impurity regions.

In a further aspect of the present invention, the method of fabricating a nonvolatile memory device having a first conductivity type substrate includes the steps of forming isolation layers in a matrix form on the substrate, forming a gate insulating layer on the entire surface of the substrate, forming conductive lines on the gate insulating layer to cover the isolation layers, forming first sidewall spacers on both sides of the conductive lines, forming a plurality of buried impurity regions having a second conductive type in the substrate between the conductive lines, forming a dielectric layer on the conductive lines, forming a plurality of control gate lines and cap insulating layers on the dielectric layer, forming second sidewall spacers on both sides of the cap insulating layer and the control gate line, selectively removing the dielectric layer and the conductive lines with the control gate lines and the second sidewall spacers serving as masks to form a plurality of floating gates, forming a tunneling insulating layer on both sides of the floating gates, and forming a plurality of program gate lines parallel to the impurity regions between the impurity regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1A:
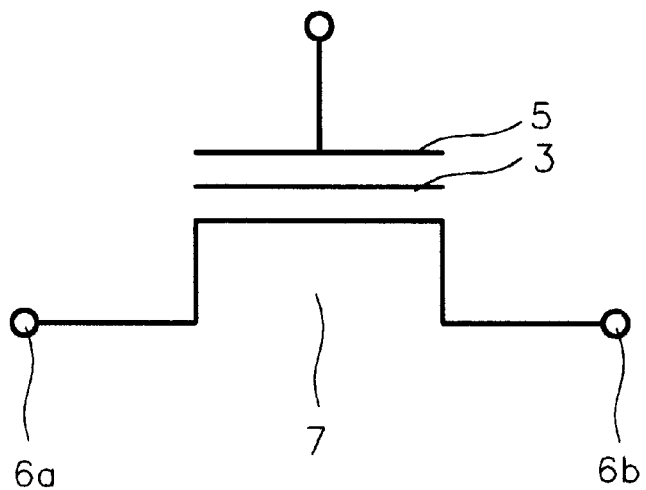
FIG. 1A is a circuit diagram of a conventional nonvolatile memory device having a simple stacked-gate structure.
Figure 1B:
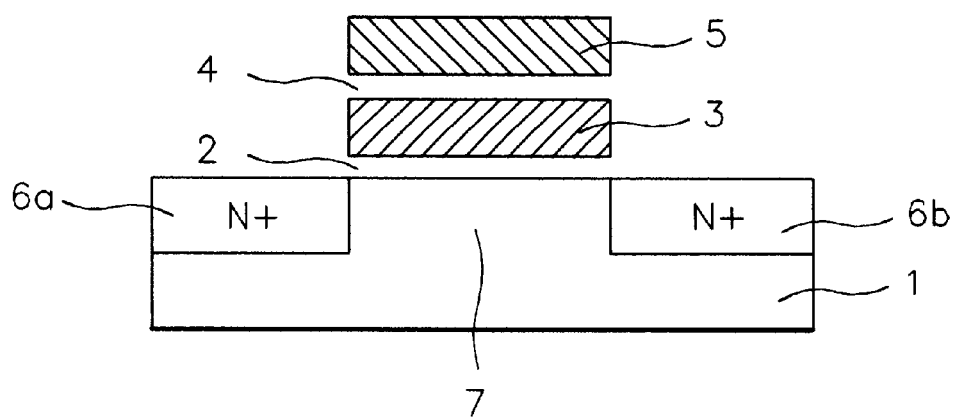
FIG. 1B is a cross-sectional view of a conventional nonvolatile memory having a simple stacked-gate structure.
Figure 2:
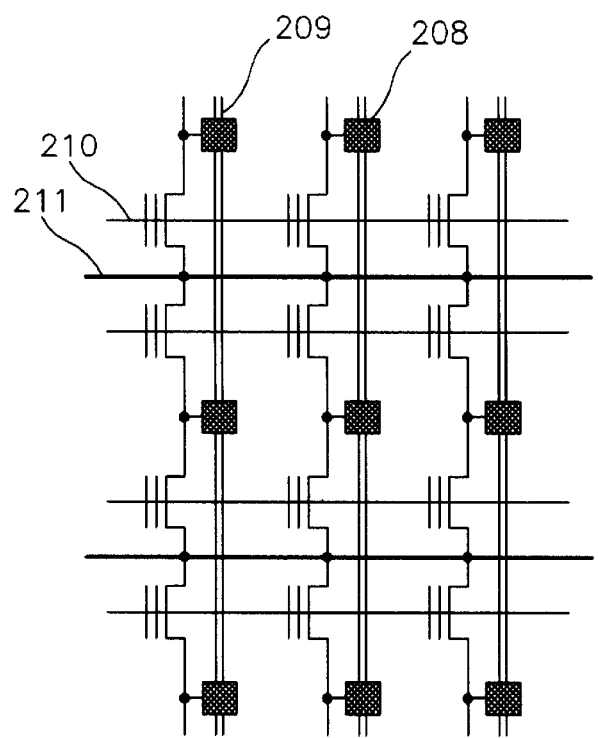
FIG. 2 is a circuit diagram of an array of another conventional nonvolatile memory device.
Figure 3:
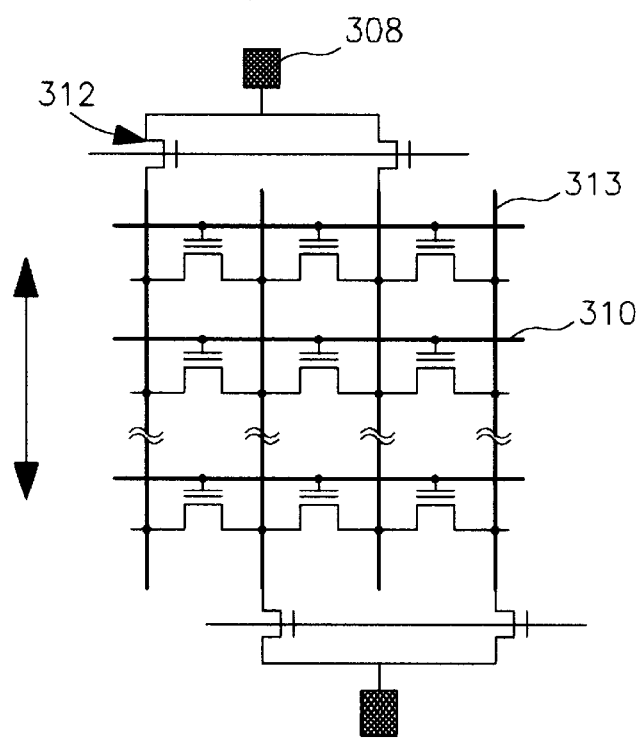
FIG. 3 is a circuit diagram of contactless array of another conventional nonvolatile memory device having a simple stacked-gate structure.
Figure 4:
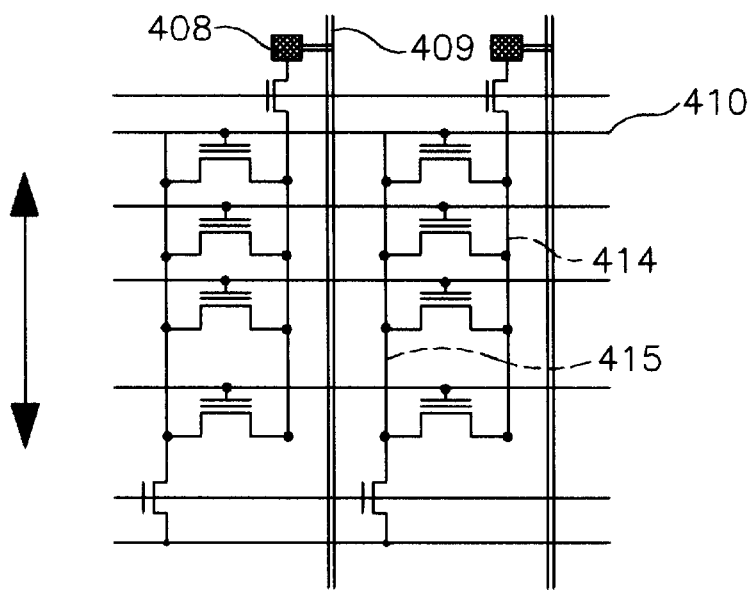
FIG. 4 is a circuit diagram of another conventional nonvolatile memory device having source and drain of each cell without contact holes.
Figure 5:
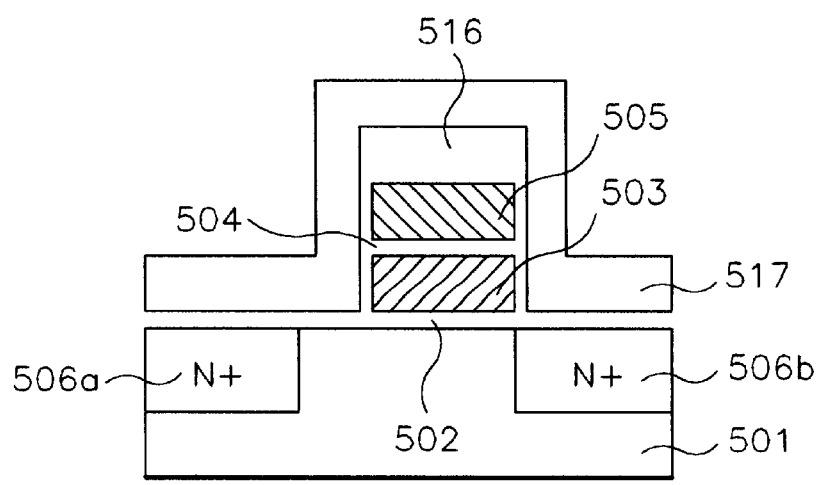
FIG. 5 is a cross-sectional view showing another conventional channel-split type memory cell having divided gates.
Figure 6A:
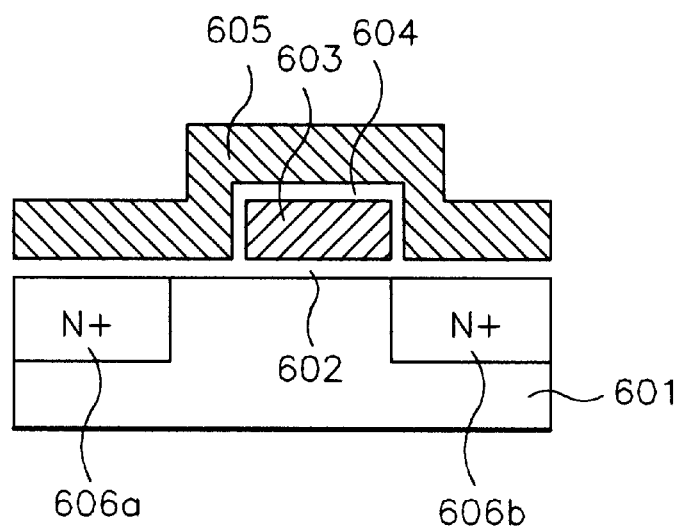
FIG. 6A is a cross-sectional view of a conventional channel-split type nonvolatile memory cell shown in FIG. 5.
Figure 6B:
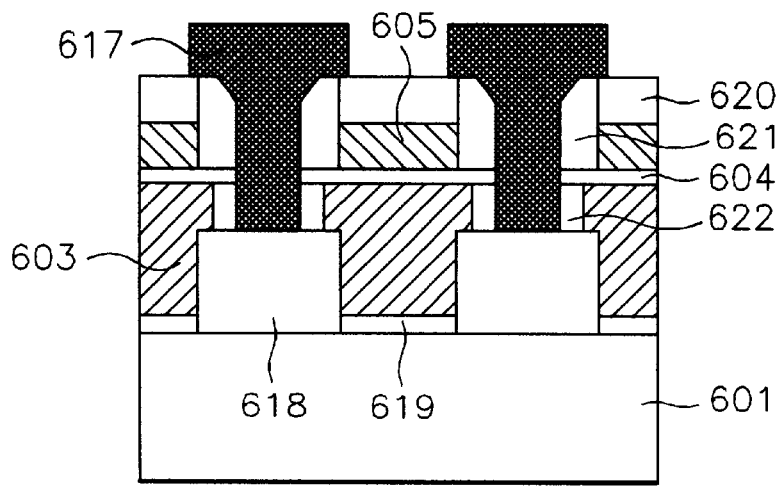
FIG. 6B is a cross-sectional view of the conventional channel-split type nonvolatile memory cell shown in a direction of channel width shown in FIG. 6A.
Figure 7:
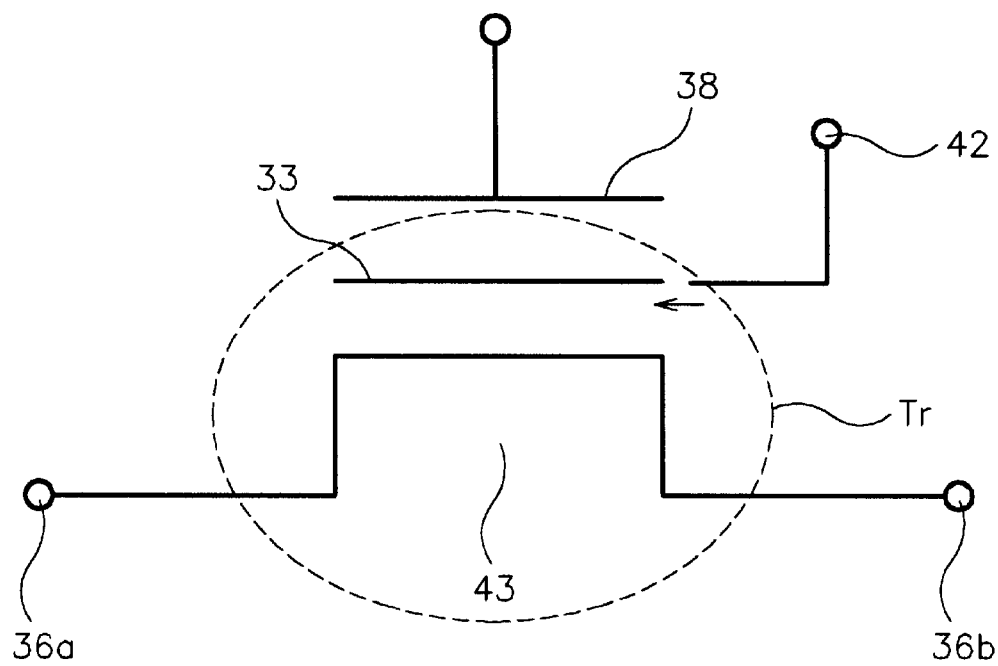
FIG. 7 is a circuit diagram of a nonvolatile memory cell in accordance with the present invention.

As shown in FIG. 7, a nonvolatile memory cell includes a control gate 38, a floating gate 33, a program gate 42, a source 36a, a channel region 43, and a drain 36b. A tunneling oxide layer (not shown) is formed between the program gate 42 and the floating gate 33, so that the cell is programmed by a tunneling effect. Thus, the program gate 42 provides the floating gate 33 with charges through tunneling, thereby performing the programming. For example, during the operation of nonvolatile n-channel memory cells, electrons are injected from the program gate 42 to the floating gate 33 by tunneling.

In applying a bias to the cell for programming, when applied positive and negative voltages are high enough to the control gate 38 and the program gate 42, tunneling occurs through the floating gate 33. Alternatively, 0 V and a positive voltage may be applied to the program gate 42 and the control gate 38 to generate the tunneling.

However, for generating a drain current, bias voltages are applied to the source and drain 36a and 36b simultaneously when both positive and negative voltages are applied to the control gate 38 and the program gate 42. If the drain current is monitored by a sensing amplifier, changes in the amount of charges of the floating gate 33a can be measured during the programming. In this step, when the applied bias for programming is high enough and an electric field for programming is also high enough, the channel is turned on at an early stage of the programming.

When the programming is proceeding, the amount of charges in the floating gate 33 changes. The change in the amount of charges is also monitored by a field effect transistor (FET) having a floating gate 33, a source 36a, and a drain 36b.

The above nonvolatile memory cell becomes a four terminal floating-gate FET during the programming. In addition, the current path for programming and monitoring are completely separated from each other. Thus, the steps of programming and monitoring are optimized separately.

Figure 8:
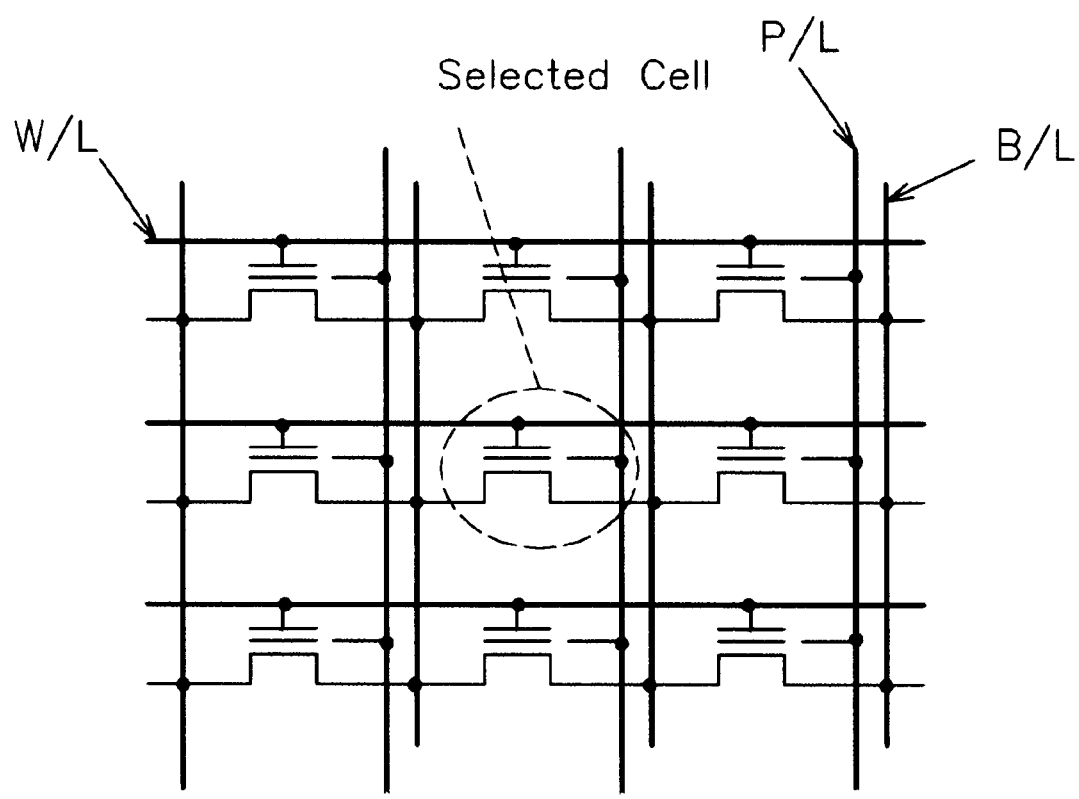
FIG. 8 is a circuit diagram of an array of nonvolatile memory cells in accordance with the present invention.
Figure 9:
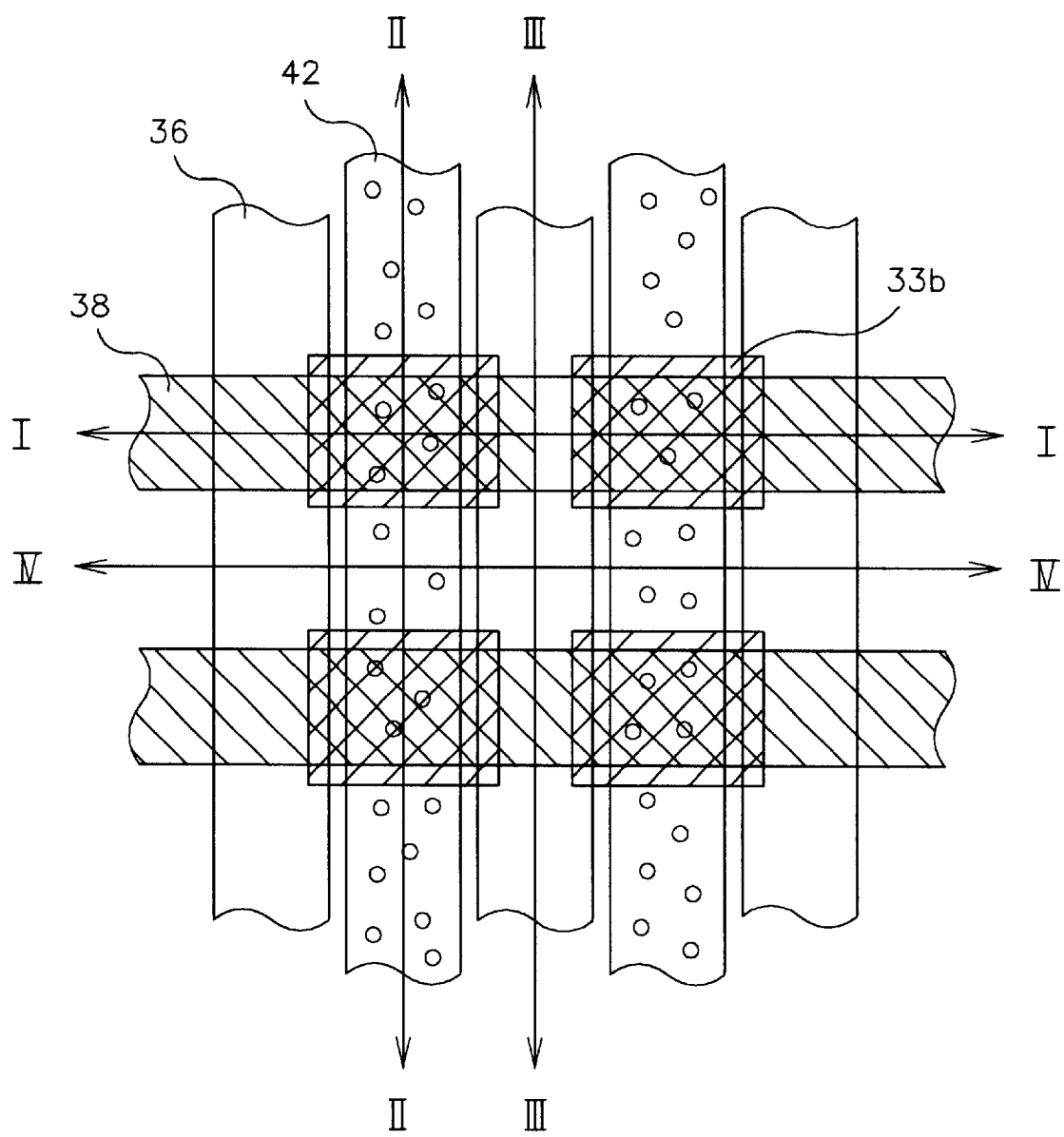
FIG. 9 is a layout of a nonvolatile memory device in accordance with the present invention.
Figure 10A:
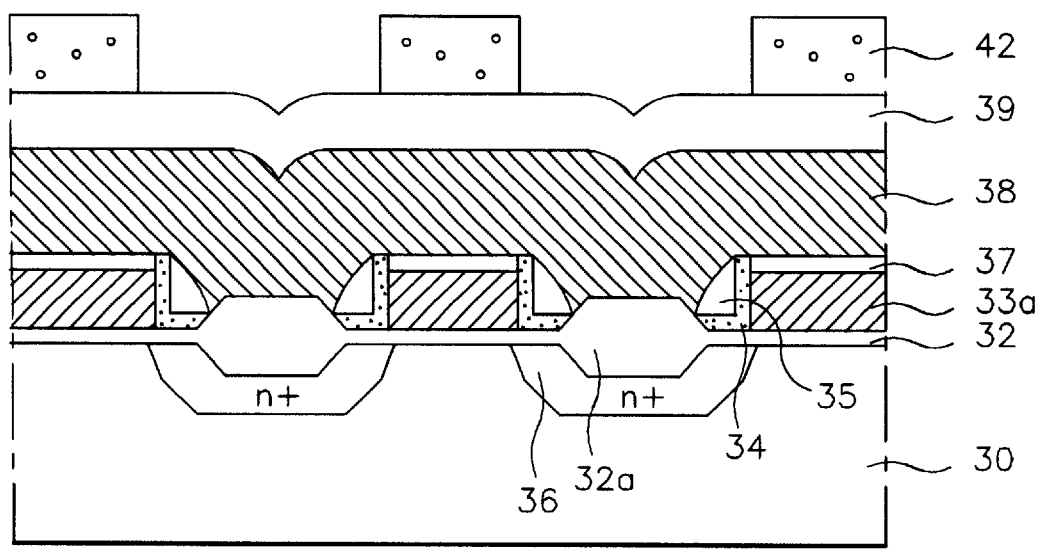
FIG. 10A is a cross-sectional view showing the nonvolatile memory cell, taken along line I—I of FIG. 9.
Figure 10B:
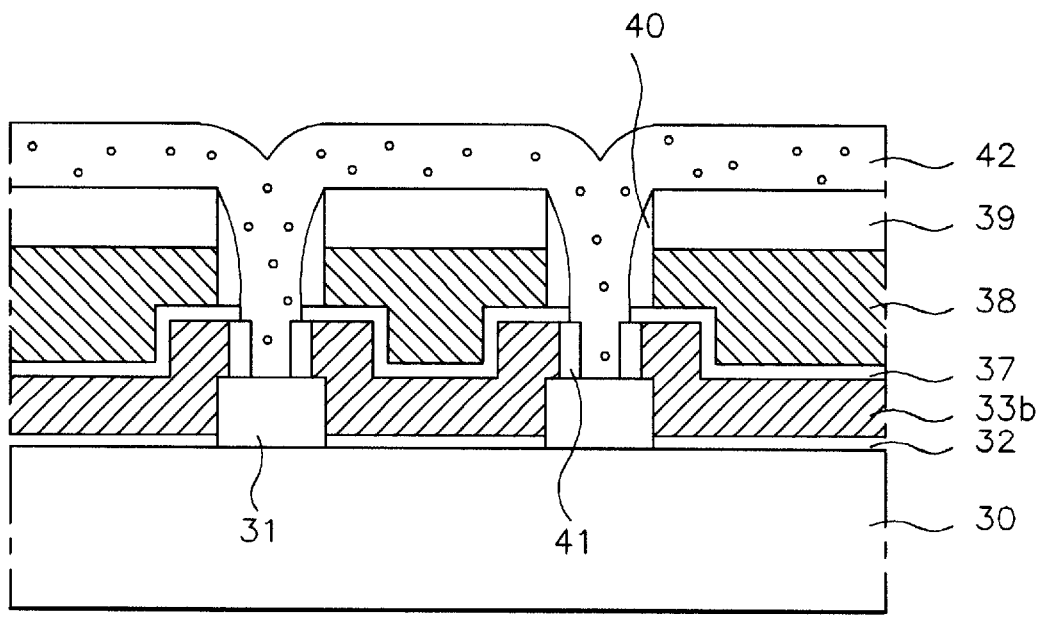
FIG. 10B is a cross-sectional view showing the nonvolatile memory cell, taken along line II—II of FIG. 9.
Figure 10C:
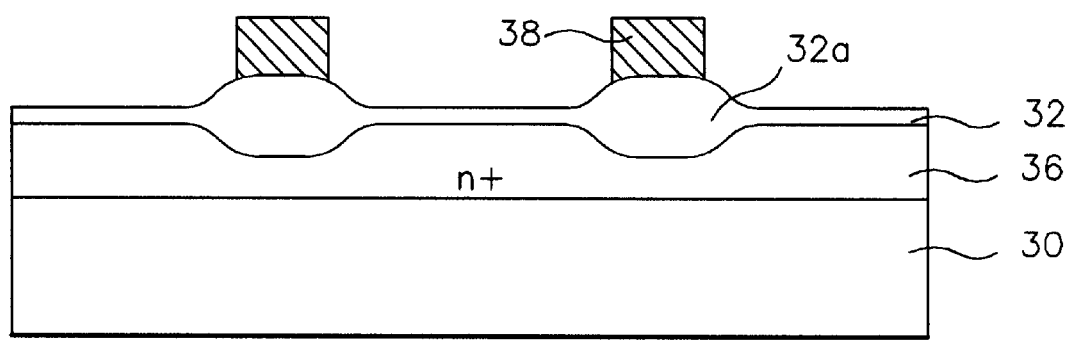
FIG. 10C is a cross-sectional view showing the nonvolatile memory cell, taken along line III—III of FIG. 9.
Figure 10D:
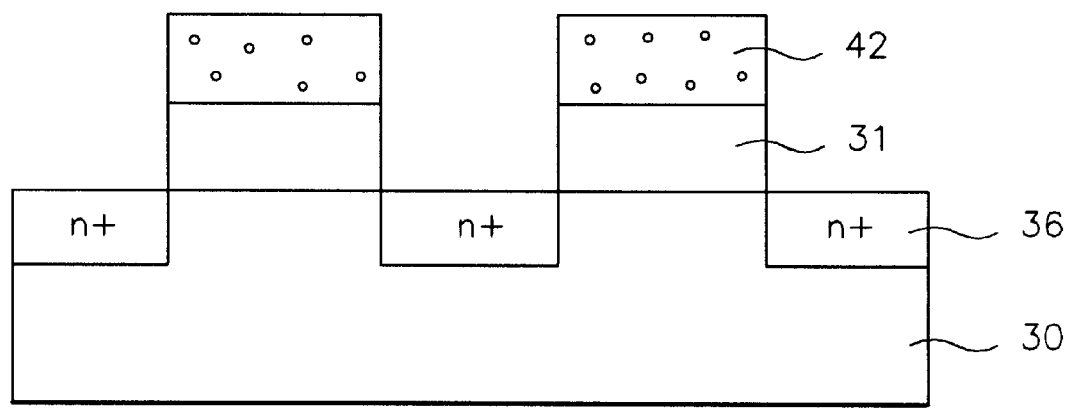
FIG. 10D is a cross-sectional view showing the nonvolatile memory cell, taken along line IV—IV of FIG. 9.

As shown in FIG. 8, a nonvolatile memory device includes a plurality of word lines W/L spaced apart from one another by a predetermined distance on a semiconductor substrate (not shown), a plurality of bit lines B/L spaced apart and perpendicular to the word lines W/L and the word lines W/L and the bit lines B/L forming a plurality of squares, a plurality of program lines P/L formed in the same direction as the bit lines P/L, and a plurality of nonvolatile memory cells each disposed to be formed in each of the squares.

Specifically, each nonvolatile memory cell, as shown in FIG. 7, includes a floating gate 33, a program gate 42 for providing the floating gate 33 with charges for programming, a control gate 38 for adjusting the amount of charges for the floating gate 33 for programming, and a FFT Tr for reading or verifying the amount of the charge carriers in the floating gate 33 during the programming.

The FFT Tr includes a floating gate 33, a source 36a, a drain 36b, and a channel region 43 formed between the source and drain 36a and 36b. The control gate 38 in the nonvolatile memory cell is connected to the adjacent word line W/L and the program gate 42 is connected to the adjacent program line P/L.

A selected cell should satisfy the selectivities for both programming and monitoring in order to carry out both programming and monitoring simultaneously. Since monitoring is the same function as reading, there should be selectivity between the programming and reading.

On the other hand, a voltage for reading is applied to the word line W/L and the bit line B/L for the selectivity of monitoring. For example, when a positive voltage and a sensing voltage are applied to the word line W/L and the selected bit line B/L, respectively, and a ground voltage is applied to the bit lines B/L at both sides of the selected cell, a sensing current is prevented from flowing to deselected cells. Simultaneously, bias voltages for programming are applied to the selected word line W/L and program line P/L, thereby causing tunneling. In this step, since electrons should be injected from the program gate 42 to the floating gate 33 in a channel cell, positive and negative voltages are applied to the word line W/L and the program line P/L, respectively.

In order to prevent programing disturbance in the deselected cells, appropriate voltages may be applied to the deselected word lines W/L and the program lines P/L. The voltages applied to the word lines W/L and the program lines P/L should be disposed so as to turn on the cell at the early step of the programming. If a capacitive coupling constant of the program gate 42 is very low, the above described condition can be satisfied.

In other words, since the program gate 42 is formed on insulating regions between cells and the contact area between the program gate 42 and the floating gate 33a has a thickness the same as the program gate 42, the coupling constant can be adjusted to be a very small value.

Operation of erasing in a nonvolatile memory device will now be described as following. Erasing can be performed through a gate oxide layer of the cell to the substrate or to the program gate 42. When the erasing is performed to the substrate, a thickness of a gate oxide layer should be about 10 nm for tunneling. Also, a negative voltage or a ground voltage is applied to the control gate 38 and a positive voltage is applied to the substrate.

On the other hand, when the erasing is executed to the program gate 42, both programming and erasing are achieved through the program gate 42. For this reason, reliability of the tunneling oxide layer should be carefully considered.

Referring to FIGS. 9, 10A, 10B, 10C, and 10D, a structure of a nonvolatile memory device of the present invention is described as following.

In a nonvolatile memory device of the present invention, after defining active regions in a p-type semiconductor substrate 30, a plurality of field oxide layers 31 are formed in a matrix form and then a gate insulating layer 32 is formed on the active regions of the semiconductor substrate 30.

Subsequently, a first polysilicon layer is deposited on the entire surface of the semiconductor substrate 30 including the field oxide layers 31 and then is subject to a photo-etching process to form floating gate lines 33a covering the field oxide layers 31.

Thereafter, a first insulating layer 34 and the first sidewall spacers 35 are formed. With the first insulating layer 34 and the first sidewall spacers 35 serving as masks, n-type impurity ions are heavily implanted into the semiconductor substrate 30 between the floating gate lines 33a to form a plurality of buried heavily-doped impurity regions 36. Next, an annealing process is performed to the heavily doped impurity regions 36 to diffuse the impurity ions and to thermally oxidize the impurity regions 36, thereby forming a gate insulating layer 32a over the impurity regions 36 thicker than a gate insulating layer 32.

Next, a dielectric layer 37 is formed on the floating gate lines 33a. The cap insulating layers 39 and a plurality of control gate lines 38 are formed to be spaced a part from one another by a predetermined distance and perpendicular to the floating gate lines 33a. The cap insulating layers 39 have a width narrower than the floating gate lines 33a.

Subsequently, second oxide sidewall spacers 40 are formed on both sides of the control gate lines 38 and the cap insulating layers 39. With the second oxide sidewall spacers and the control gate lines 38 serving as masks, the dielectric layer 37 and the floating gate lines 33a are selectively etched to form a plurality of floating gates 33b. Then, a tunneling insulating layer 41 is formed on both sides of the floating gate 33b and a plurality of program lines 42 are formed parallel to and between the heavily doped impurity regions 36.

A method of fabricating a nonvolatile memory device having the aforementioned structure will now be described.

Figure 11A:
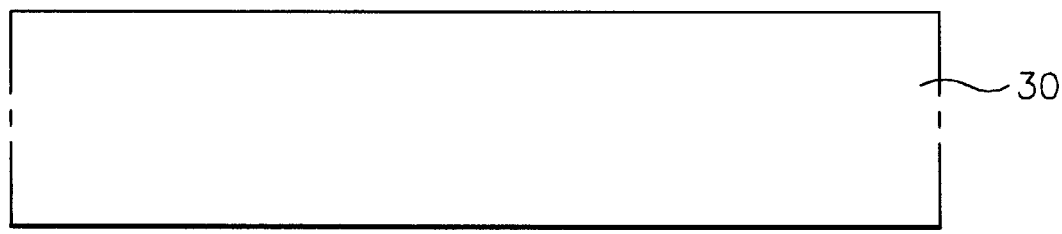
FIGS. 11A to 11I are cross-sectional views showing process steps of fabricating a nonvolatile memory device, taken along line I—I of FIG. 9.
Figure 12A:
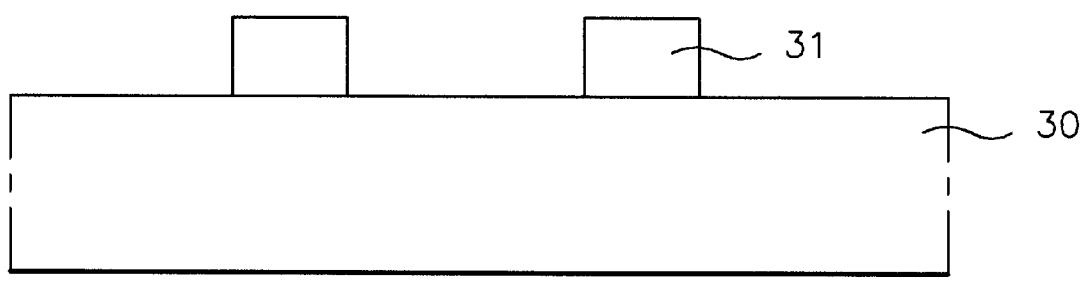
FIGS. 12A to 12I are cross-sectional views showing process steps of fabricating a nonvolatile memory device, taken along line II—II of FIG. 9.

Referring to FIGS. 11A and 12A, active regions are defined in a p-type semiconductor substrate 30. Next, an oxide layer is deposited on the semiconductor substrate 30 and then is subject to an photo-etching process to form a plurality of field oxide layers 31 having a matrix form and spaced apart from one another by a predetermined distance.

Figure 11B:
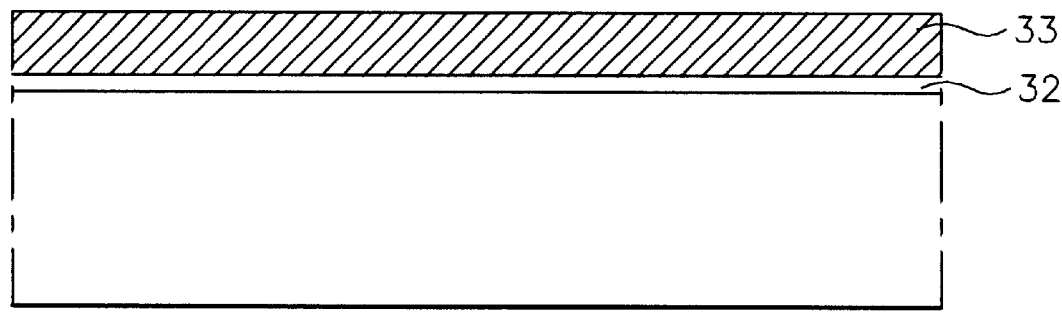
Figure 12B:
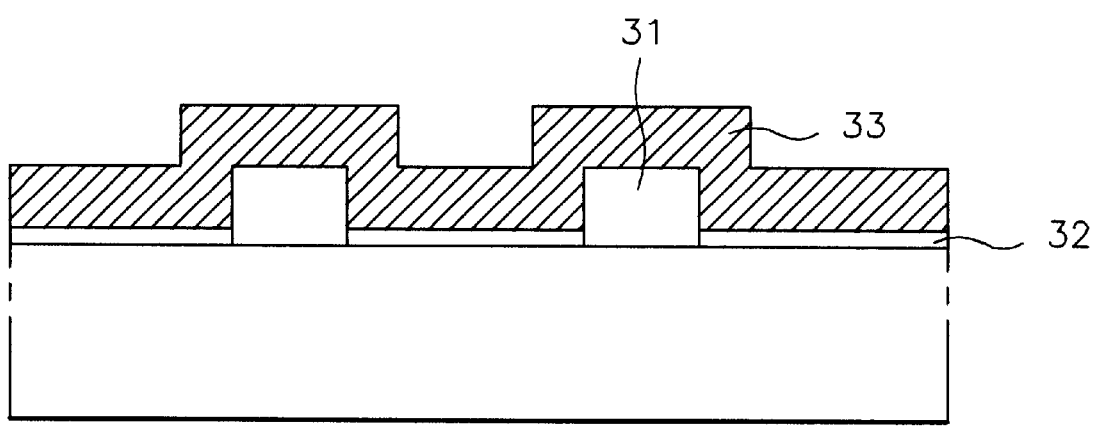

Referring to FIGS. 11B and 12B, a gate insulating layer 32 (for example, an oxide), is formed on the active regions between the field oxide layer 31. Subsequently, a first polysilicon layer 33 is deposited on the gate insulating layer 32 including the field oxide layers 31.

Figure 11C:
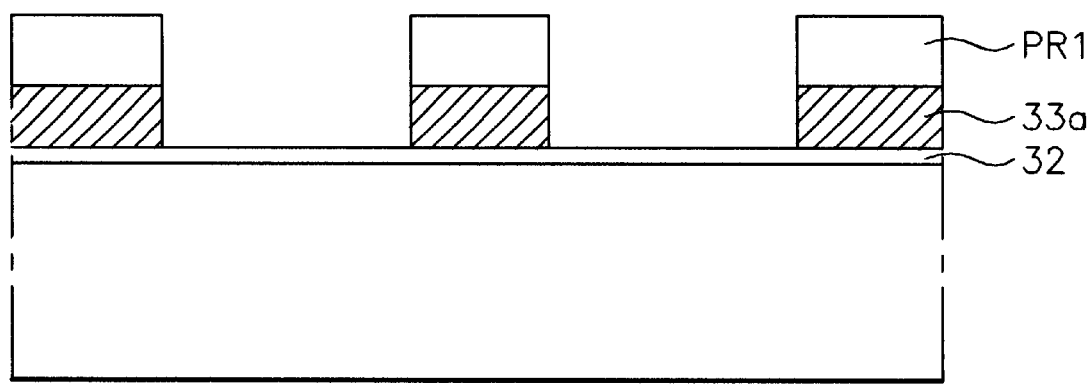
Figure 12C:
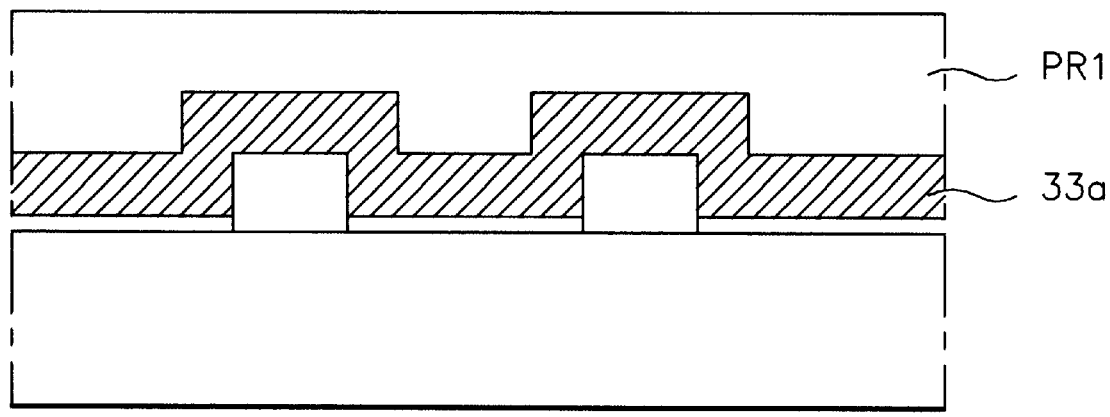

Referring to FIGS. 11C and 12C, a first photoresist layer PR1 is coated on the first polysilicon layer 33 and then is patterned with an exposure and development process after defining floating gate lines. With the first photoresist pattern serving PR1 as a mask, the first polysilicon layer 33 is selectively removed, thereby forming the floating gate lines 33a.

Figure 11D:
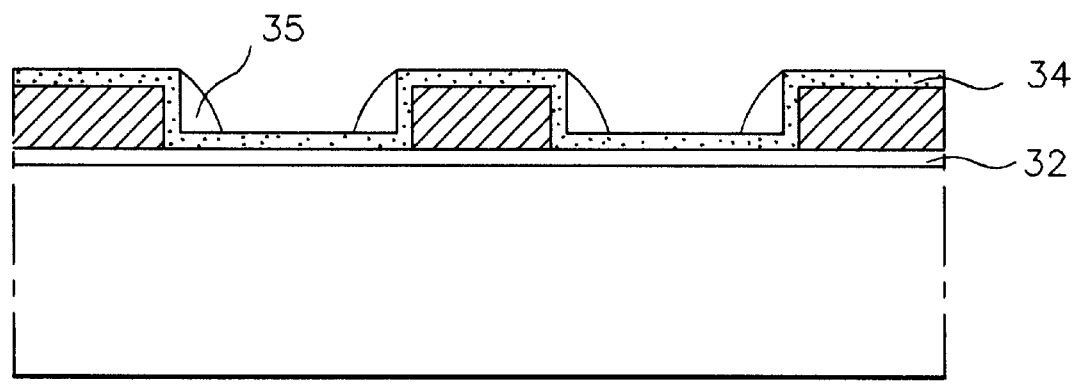
Figure 12D:
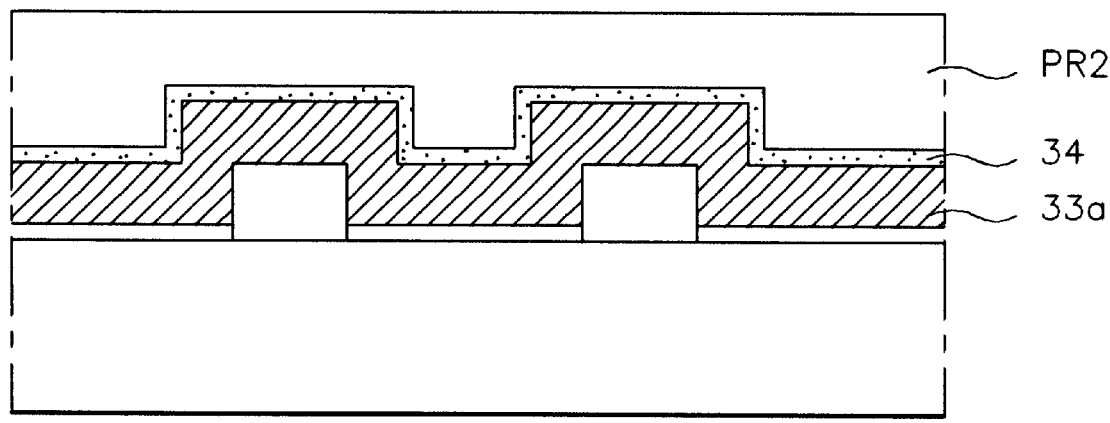

Referring to FIGS. 11D and 12D, the remaining photoresist film PR1 is removed. Next, a first insulating layer 34 are formed on the floating gate line 33a including the gate insulating layer 32. For example, the first insulating layer 34 including nitride.

Therefore, a second photoresist film PR2 is coated on the entire surface. A second insulating layer is formed on the first insulating layer 34 and then subject to an etch-back process to form first sidewall spacers 35 on both sides of the first insulating layer 34.

Figure 11E:
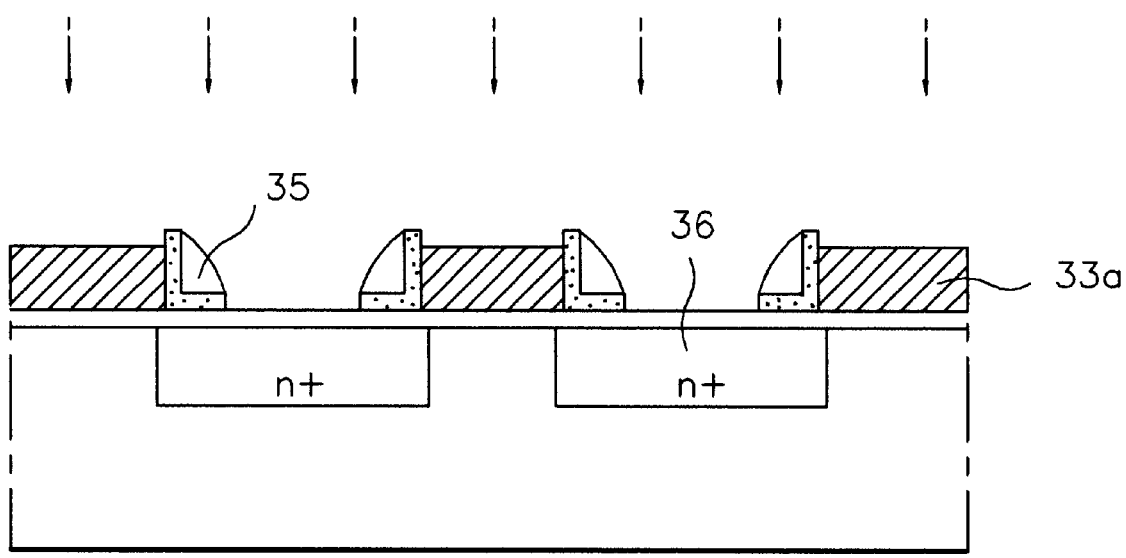
Figure 12E:
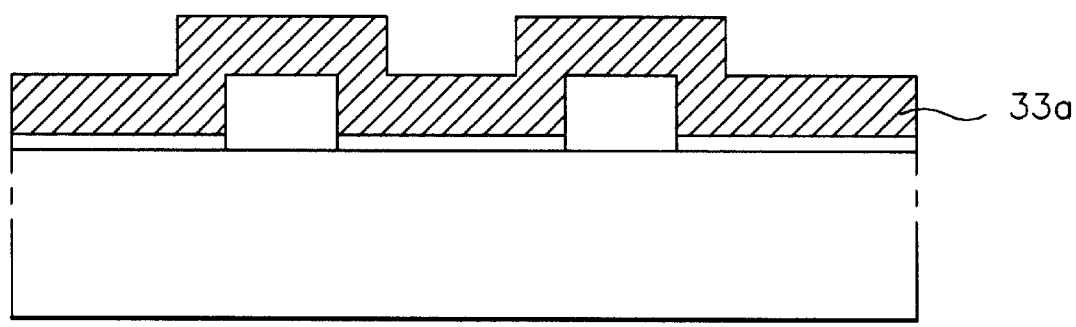

Referring to FIGS. 11E and 12E, the remaining second photoresist film PR2 is removed. Next, with the first sidewall spacers 35 serving as a mask, the first insulating layer 34 is removed by an etching process. With the remaining first insulating layer 34 and the first sidewall spacers 35 serving as masks, n-type impurity ions are heavily doped to form a plurality of heavily doped impurity regions 36 below the surface of the semiconductor substrate 30. The heavily doped impurity regions 36 are partially overlapped with the floating gate lines 33a. The impurity regions 36 are used as bit lines.

Figure 11F:
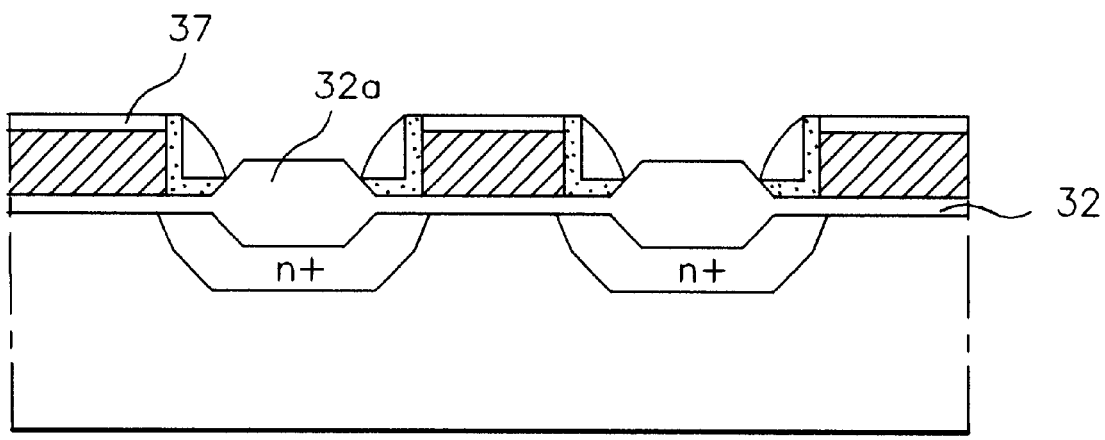
Figure 12F:
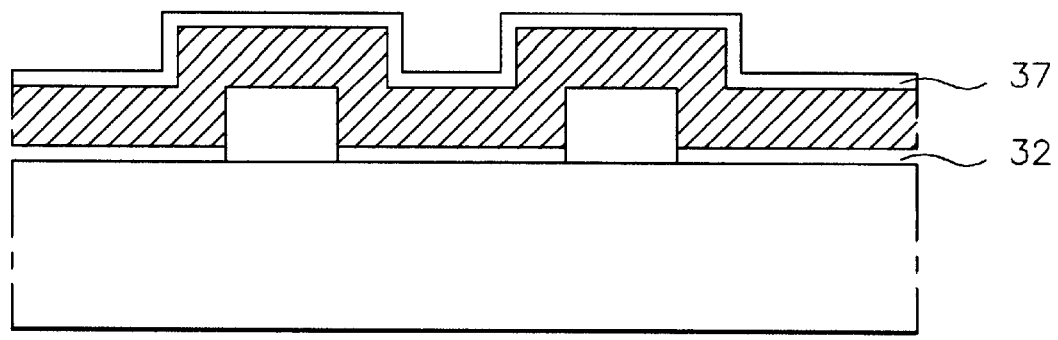

Referring to FIGS. 11F and 12F, an annealing process is performed to the heavily doped impurity regions 36 to diffuse the injected impurity ions and thermally oxidize the impurity regions to form a gate insulating layer 32a. In this process, the gate insulating layer 32a on the impurity regions 36 has a thickness greater than the gate insulating layer 32. Thereafter, a thermal oxidation process is performed over the floating gate lines 33a to form dielectric layer 37.

Figure 11G:
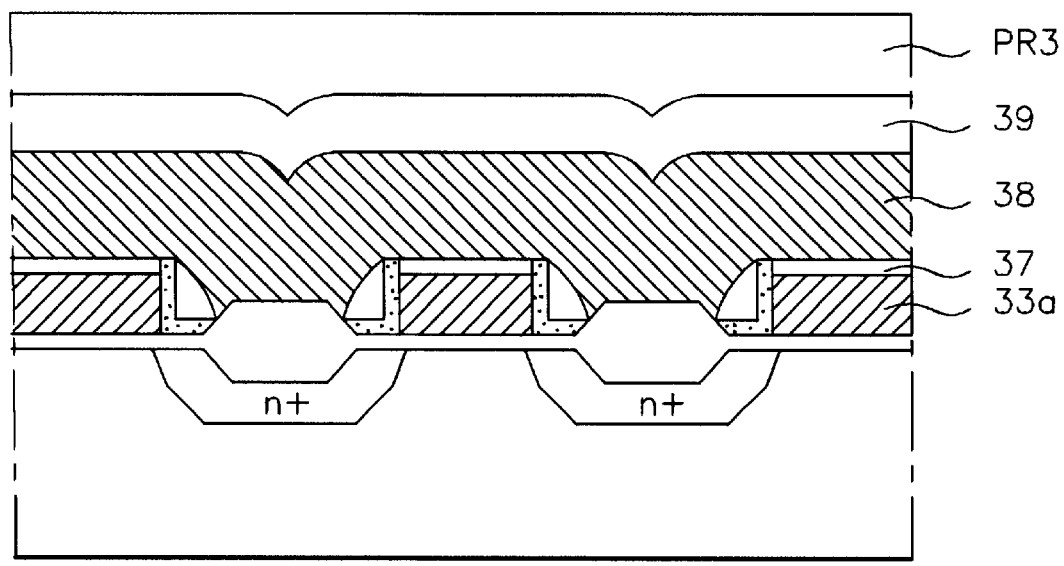
Figure 12G:
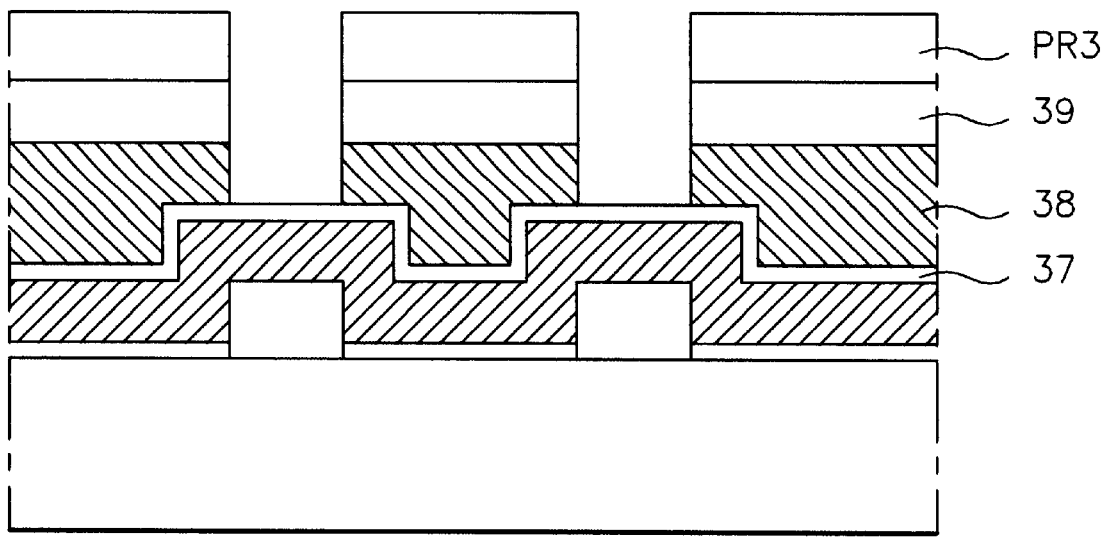

Referring to FIGS. 11G and 12G, a second polysilicon layer and a cap insulating layer 39 are successively deposited on the dielectric layer 37. A third photoresist layer PR3 is then coated on the cap insulating layer 39 and subject to an exposure and development process to define control gate lines. Subsequently, the third photoresist film PR3 is patterned.

With the third photoresist pattern PR3 serving as a mask, the second polysilicon layer and the cap insulating layer 39 are selectively removed by an etching process, thereby forming control gate lines 38 perpendicular to the floating gate lines 33a. A width of the control gate lines 38, to be used as word lines, is narrower than that of the floating gate lines 33a.

Figure 11H:
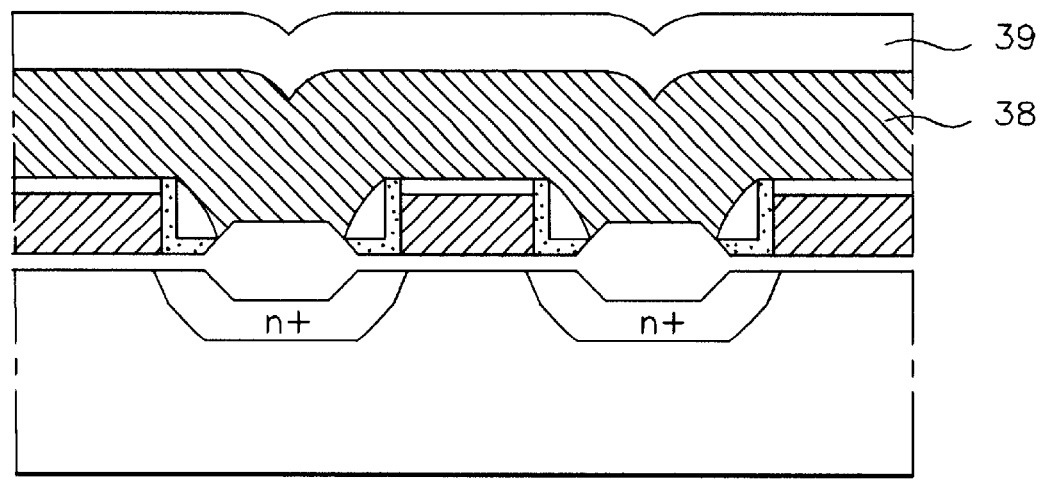
Figure 12H:
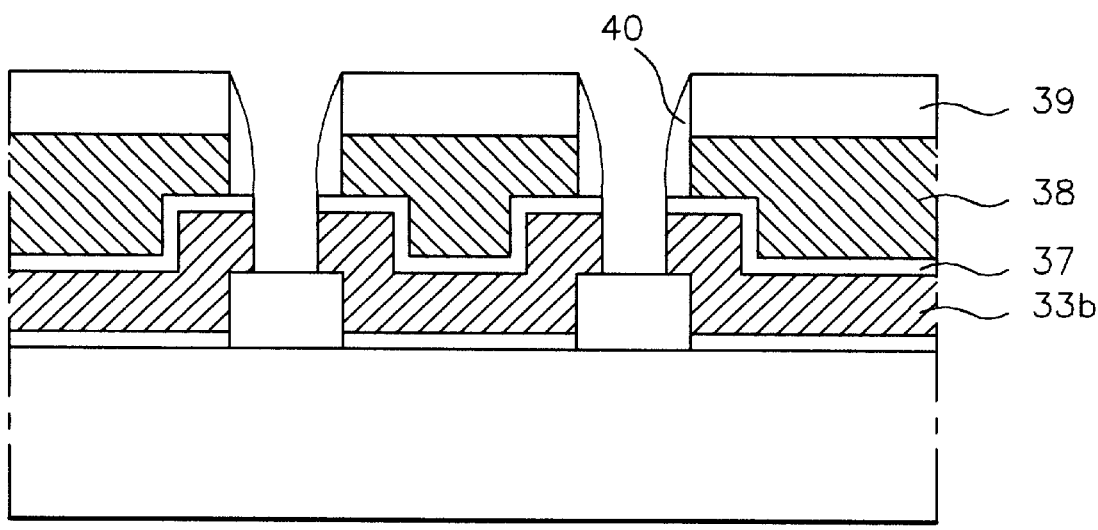

Referring to FIGS. 11H and 12H, the remaining photoresist film PR3 is removed. Thereafter, a third insulating layer is deposited on the cap insulating layer 39 and then is etched-back to form second sidewall spacers 40 on both sides of the control gate lines 38a and the cap insulating layer 39. With the second sidewall spacers 40 as masks, the dielectric layer 37 and the floating gate lines 33a are selectively etched to form floating gates 33b.

Figure 11I:
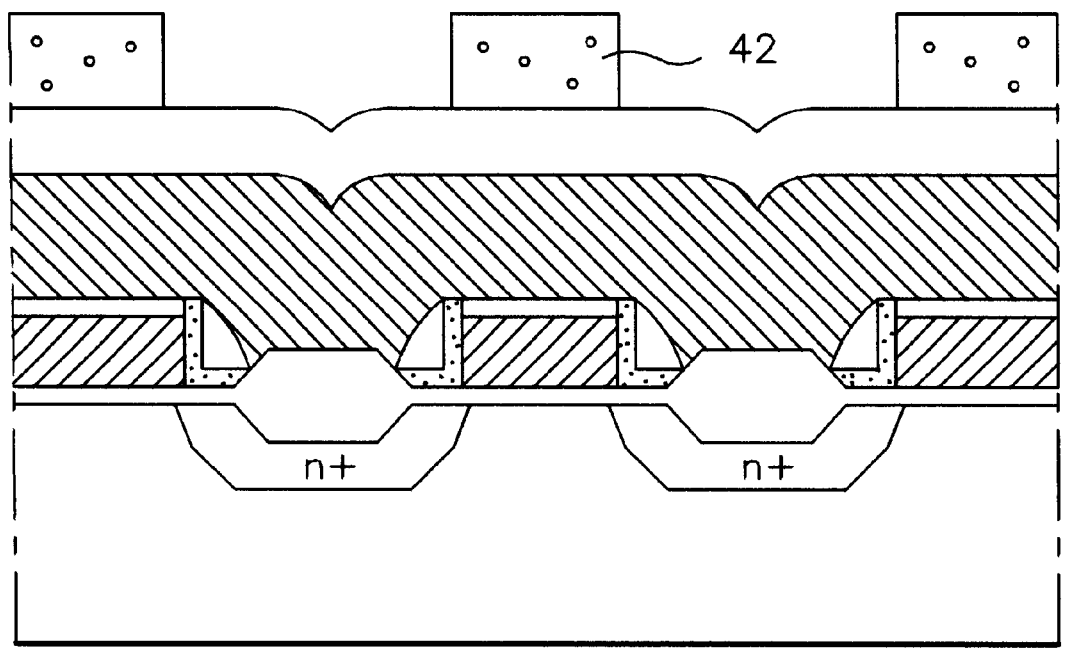
Figure 12I:
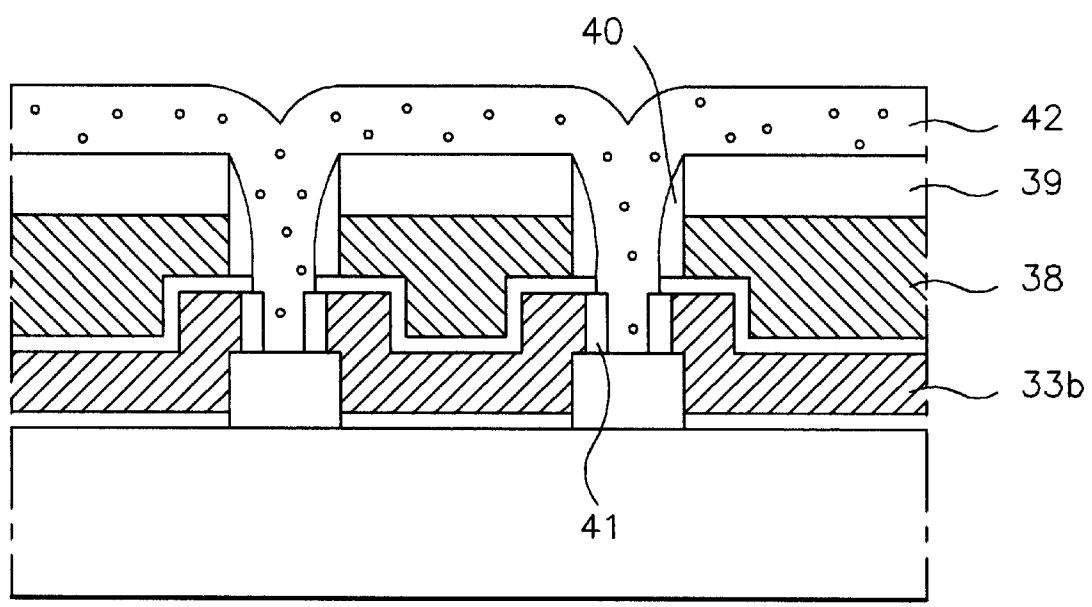

Referring to FIGS. 11I and 12I, a thermal oxidation process is performed on both sides of the floating gates 33b to form a tunneling insulating layer 41. Next, program gate lines 42 are formed over the heavily doped impurity regions 36 including the cap insulating layer 39. The program gate lines 42 are parallel to the heavily doped impurity regions 30.

The method of fabricating a nonvolatile memory device according to the present invention has following advantages.

Since the nonvolatile memory device becomes a four terminal floating-gate FET during programming, the current paths for programming and monitoring are completely separated from each other, thereby optimizing both programming and monitoring separately.

Further, nonvolatile memory cells have a simple stacked-gate structure with program gates to form a contactless array. The program gates are also formed over isolation layers. Therefore, a minimum effective cell size for enabling the tunneling program is obtained, so that the cell size is not affected by the program gates.

It will be apparent to those skilled in the art that various modification and variations can be made in the method of fabricating a nonvolatile memory device of the present invention without departing from the spirit or scope of the inventions. Thus, it is intended that the present invention cover the modifications and variations of this invention provided they come within the scope of the appended claims and their equivalents.

What is claimed is:

1. A method of fabricating a nonvolatile memory device having a first conductivity type substrate, comprising the steps of:

forming a gate insulating layer on the substrate;

forming a plurality of floating gate lines on the gate insulating layer, wherein a top surface of the floating gate lines has a varying distance from a surface of the substrate and the top surface includes a step surface;

forming first sidewall spacers on both sides of each floating gate lines;

forming a plurality of impurity regions having a second conductivity type in the substrate between the floating gate lines;

forming a dielectric layer on the floating gate lines;

forming a plurality of control gate lines on the dielectric layer;

forming second sidewall spacers on both sides of the control gate lines;

selectively etching the dielectric layer and the floating gate lines to form a plurality of floating gates;

forming tunneling insulating layers on both sides of the floating gates; and forming a plurality of program lines between the impurity regions.

2. The method according to claim 1, further comprising the step of forming a first insulating layer on the floating gate lines before the step of forming first sidewall spacers.

3. The method according to claim 1, further comprising the step of forming a plurality of cap insulating layers on the control gate lines before the step of forming second sidewall spacers.

4. The method according to claim 3, wherein the cap insulating layers are formed to be perpendicular to the floating gate lines.

5. The method according to claim 1, wherein the floating gate lines are formed by polysilicon.

6. The method according to claim 2, wherein the first insulating layer is formed of nitride.

7. The method according to claim 1, wherein the second sidewall spacers are formed of oxide.

8. The method according to claim 1, wherein the dielectric layer is formed by a thermal oxidation process.

9. The method according to claim 1, wherein the step of forming the impurity regions comprises the steps of:
   implanting impurity ions into the substrate with the floating gate lines and the first sidewall spacers serving as masks; and
   annealing to diffuse the impurity ions and thermally oxidize the impurity regions.

10. The method according to claim 9, wherein the impurity regions are covered with the gate insulating layer having a thickness greater than the other area.

11. The method according to claim 1, wherein the tunneling insulating layer is formed by a thermal oxidizing process.

12. The method according to claim 1, wherein the floating gates have a width greater than the control gates lines.

13. The method according to claim 1, wherein the impurity regions are used as bit lines.

14. The method according to claim 1, wherein the control gate lines are used as word lines.

15. A method of fabricating a nonvolatile memory device having a first conductivity type substrate comprising the steps of:
   forming isolating layers in a matrix form on the substrate;
   forming a gate insulating layer on the entire surface of the substrate;
   forming conductive lines on the gate insulating layer to cover the isolation layers, wherein a top surface of the conductive lines has a varying distance from a surface of the substrate and the top surface includes a step surface;
   forming first sidewall spacers on both sides of the conductive lines;
   forming a plurality of buried impurity regions having a second conductivity type in the substrate between the conductive lines;
   forming a dielectric layer on the conductive lines;
   forming a plurality of control gate lines and cap insulating layers on the dielectric layer;
   forming second sidewall spacers on both sides of the cap insulating layer and the control gate line;
   selectively removing the dielectric layer and the conductive lines with the control gate lines and the second sidewall spacers serving as masks to form a plurality of floating gates;
   forming a tunneling insulating layer on both sides of the floating gates;
   forming a plurality of program gate lines parallel to the impurity regions between the impurity regions.

16. The method according to claim 15, wherein the conductive lines between the isolation layers are selectively etched to form the floating gates.

17. The method according to claim 15, wherein the impurity regions are used as bit lines.

18. The method according to claim 15, wherein the control gate lines are used as word lines.

19. The method according to claim 15, wherein the conductive lines are formed of polysilicon.

20. The method according to claim 15, wherein the second sidewall spacers are formed of oxide.

21. The method according to claim 15, wherein the dielectric layer is formed by a thermal oxidizing process.

22. The method according to claim 15, wherein the step of forming the buried impurity regions comprises the steps of:
   implanting impurity ions into the substrate with the conductive lines and the first sidewall spacers serving as masks; and
   annealing to diffuse the implanted impurity ions and oxidize the impurity regions.

23. The method according to claim 22, wherein the buried impurity regions are covered with the gate insulating layer having a thickness greater than the other area.

24. The method claim 15, wherein the tunneling insulating layer is formed by a thermal oxidizing process.

25. The method according to claim 11, wherein the floating gates has a width greater than the control gate lines.

* * * * *